United States Patent
Kou

(10) Patent No.: US 9,162,286 B2
(45) Date of Patent: Oct. 20, 2015

(54) GLASS SUBSTRATE FILM SPUTTERING TARGET AND PREPARING METHOD THEREOF

(75) Inventor: Hao Kou, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 923 days.

(21) Appl. No.: 13/380,861

(22) PCT Filed: Dec. 12, 2011

(86) PCT No.: PCT/CN2011/083799
§ 371 (c)(1),
(2), (4) Date: Dec. 26, 2011

(87) PCT Pub. No.: WO2013/082822
PCT Pub. Date: Jun. 13, 2013

(65) Prior Publication Data
US 2013/0140174 A1    Jun. 6, 2013

(30) Foreign Application Priority Data
Dec. 5, 2011   (CN) .......................... 2011 1 0398619

(51) Int. Cl.
| B22F 3/14 | (2006.01) |
| C23C 14/34 | (2006.01) |
| C22C 30/02 | (2006.01) |
| B22F 1/00 | (2006.01) |
| C04B 35/457 | (2006.01) |
| B82Y 30/00 | (2011.01) |

(52) U.S. Cl.
CPC ................ *B22F 3/14* (2013.01); *B22F 1/0018* (2013.01); *B82Y 30/00* (2013.01); *C04B 35/457* (2013.01); *C22C 30/02* (2013.01); *C23C 14/3414* (2013.01); *B22F 2999/00* (2013.01); *C04B 2235/3286* (2013.01); *C04B 2235/6567* (2013.01); *C04B 2235/77* (2013.01)

(58) Field of Classification Search
None
See application file for complete search history.

(56) References Cited

U.S. PATENT DOCUMENTS

| 7,586,033 B2 * | 9/2009 | Ren et al. ........................ 136/239 |
| 2003/0052000 A1 * | 3/2003 | Segal et al. ............... 204/298.13 |

(Continued)

FOREIGN PATENT DOCUMENTS

| CN | 1829820 A | 9/2006 |
| CN | 101775578 A | 7/2010 |
| CN | 101942591 A | 1/2011 |
| CN | 102137826 A | 7/2011 |

(Continued)

*Primary Examiner* — George Wyszomierski
*Assistant Examiner* — Ngoclan T Mai
(74) *Attorney, Agent, or Firm* — Cheng-Ju Chiang

(57) ABSTRACT

A preparing method of a glass substrate film sputtering target is disclosed, which comprises the following steps of: weighing an alloy material for forming the glass substrate film sputtering target; adding the alloy material weighed into a plasma pressure compaction sintering cavity and sintering the alloy material to obtain a sintered target, wherein the sintering temperature is 500° C.~1600° C. and the sintering time is 5~20 minutes; and post-processing the sintered target. A glass substrate film sputtering target prepared by the preparing method is further disclosed. Because the plasma pressure compaction for quick sintering is adopted for the glass substrate film sputtering target and the preparing method thereof of the present disclosure, quality of the target can be improved and the time necessary for preparing the target can be shortened.

8 Claims, 1 Drawing Sheet

(56) References Cited

U.S. PATENT DOCUMENTS

2008/0193798 A1* 8/2008 Lemon et al. ............... 428/698
2008/0216602 A1* 9/2008 Zimmermann et al. ........ 75/245

FOREIGN PATENT DOCUMENTS

| CN | 102139371 A | 8/2011 |
| JP | 2003-81673 A | 3/2003 |

* cited by examiner

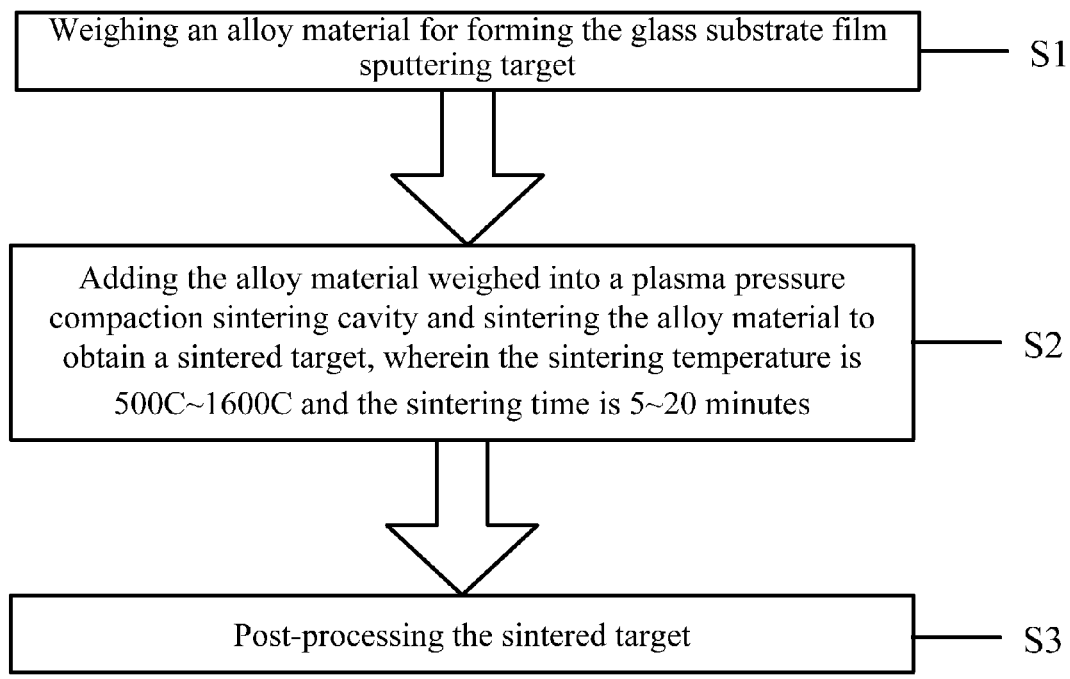

GLASS SUBSTRATE FILM SPUTTERING TARGET AND PREPARING METHOD THEREOF

FIELD OF THE INVENTION

The present disclosure generally relates to a preparing method, and more particularly, to a glass substrate film sputtering target and a preparing method thereof.

BACKGROUND OF THE INVENTION

Currently, large-size glass substrate film sputtering targets used in the thin film transistor liquid crystal display (TFT-LCD) industry are produced in a process mainly comprising the following steps: weighing→mixing granulation→forming→drying→sintering→processing. Among these steps, the forming step and the sintering step have the most prominent influence on subsequent use of the sputtering targets in panel producing factories. The primary processes currently adopted for forming and sintering include hot pressing and cool pressing. However, both hot pressing and cool pressing have the following shortcomings.

Firstly, targets prepared through these two processes all present an insufficient relative density and entrainment of gases such as oxygen inside the crystal grains and at the grain boundaries. Micro-cavities present on the target surface make distribution of the electric field on the target surface uneven, which makes it very likely to cause a strong electric field on the surface. Additionally, argon (Ar) atoms impacting the target in local regions have very high energy and can dissociate the oxygen atoms to form high resistance regions; consequently, the resulting film tends to accumulate and bulge gradually to cause poor uniformity of the resulting film and large roughness of the film surface.

Secondly, the sintering time is too long and the sintering process mainly relies on heat conduction and heat radiation of the heating element, which makes the grain size of the target too large. Consequently, the "structure inheritance effect" caused during the physical vapor deposition (PVD) process in the panel producing factory makes the grain size of the deposited film relatively large and non-uniform, which is unfavorable for development of large-size panels.

Thirdly, the finer the particle size of the sintered powder is, the more the foreign elements adsorbed will be. Therefore, aggregated foreign ions or adsorbed gas molecules will arise at the grain boundaries due to diffusion in the long-time sintering process. Similarly, pollutions that will degrade the product yield and the product quality also arise in the process of forming the film through physical vapor deposition in the panel producing factory.

Accordingly, an urgent need exists in the art to provide a preparing method of a glass substrate film sputtering target that can solve the aforesaid problems.

SUMMARY OF THE INVENTION

The primary objective of the present disclosure is to provide a glass substrate film sputtering target and a preparing method thereof, which can improve quality of the target and shorten the time necessary for preparing the target.

To achieve the aforesaid objective, an embodiment of the present disclosure provides a preparing method of a glass substrate film sputtering target, which comprises the following steps of: weighing an alloy material for forming the glass substrate film sputtering target, wherein the alloy material has a particle size of smaller than or equal to 100 nm; adding the alloy material weighed into a plasma pressure compaction sintering cavity and sintering the alloy material while a pressure is externally applied to the plasma pressure compaction sintering cavity to obtain a sintered target, wherein the sintering temperature is 500° C.~1600° C. and the sintering time is 5~20 minutes; and post-processing the sintered target.

In a preferred embodiment of the present disclosure, the alloy material has a composition of $Mo_xCu_yTi_z$, where x, y, z all range between 0~100% and x+y+z=100%.

In a preferred embodiment of the present disclosure, the sintering temperature is 1400° C.~1500° C. and the sintering time is 10~15 minutes.

In a preferred embodiment of the present disclosure, the sintered target has a relative density of greater than or equal to 99.5% and an oxygen content of smaller than or equal to 500 ppm.

In a preferred embodiment of the present disclosure, the alloy material has a composition of $(In_2O_3)_x(SnO_2)_y$, where y ranges between 0~7% and x+y=100%.

In a preferred embodiment of the present disclosure, the sintering temperature is 600° C.~700° C. and the sintering time is 10 minutes.

In a preferred embodiment of the present disclosure, the sintered target has a relative density of greater than or equal to 99.8% and an oxygen content of smaller than or equal to 1000 ppm.

To achieve the aforesaid objective, an embodiment of the present disclosure further provides a preparing method of a glass substrate film sputtering target, which comprises the following steps of: weighing an alloy material for forming the glass substrate film sputtering target; adding the alloy material weighed into a plasma pressure compaction ($P^2C$) sintering cavity and sintering the alloy material to obtain a sintered target, wherein the sintering temperature is 500° C.~1600° C. and the sintering time is 5~20 minutes; and post-processing the sintered target.

In a preferred embodiment of the present disclosure, the alloy material has a particle size of smaller than or equal to 100 nm.

In a preferred embodiment of the present disclosure, the alloy material has a composition of $Mo_xCu_yTi_z$, where x, y, z all range between 0·100% and x+y+z=100%.

In a preferred embodiment of the present disclosure, the sintering temperature is 1400° C.~1500° C. and the sintering time is 10~15 minutes.

In a preferred embodiment of the present disclosure, the sintered target has a relative density of greater than or equal to 99.5% and an oxygen content of smaller than or equal to 500 ppm.

In a preferred embodiment of the present disclosure, the alloy material has a composition of $(In_2O_3)_x(SnO_2)_y$, where y ranges between 0~7% and x+y=100%.

In a preferred embodiment of the present disclosure, the sintering temperature is 600° C.~700° C. and the sintering time is 10 minutes.

In a preferred embodiment of the present disclosure, the sintered target has a relative density of greater than or equal to 99.8% and an oxygen content of smaller than or equal to 1000 ppm.

In a preferred embodiment of the present disclosure, the preparing method further comprising externally applying a pressure to the plasma pressure compaction sintering cavity while the alloy material is sintered in the plasma pressure compaction sintering cavity.

An embodiment of the present disclosure further provides a glass substrate film sputtering target, which is prepared by the following preparing method: weighing an alloy material for forming the glass substrate film sputtering target; adding the alloy material weighed into a plasma pressure compaction (P²C) sintering cavity and sintering the alloy material to obtain a sintered target, wherein the sintering temperature is 500° C.~1600° C. and the sintering time is 5~20 minutes; and post-processing the sintered target.

The present disclosure has the following benefits as compared to the prior art: because the plasma pressure compaction for quick sintering is adopted for the glass substrate film sputtering target and the preparing method thereof of the present disclosure, quality of the target can be improved and the time necessary for preparing the target can be shortened.

BRIEF DESCRIPTION OF THE DRAWINGS

In order to more clearly describe the technical solutions of the embodiments of the present disclosure, attached drawings to be used in the detailed description of the disclosure will be briefly described hereinbelow. Obviously, the attached drawings described hereinbelow only illustrate some of the embodiments of the present disclosure, and those of ordinary skill in the art can also obtain other attached drawings therefrom without the need of making inventive efforts, wherein:

The FIGURE is a schematic view illustrating steps of a preparing method of a glass substrate film sputtering target according to a preferred embodiment of the present disclosure.

DETAILED DESCRIPTION OF THE INVENTION

Various embodiments of the disclosure are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Hereinbelow, the technical solutions of embodiments of the present disclosure will be described clearly and completely with reference to the attached drawings. Obviously, the embodiments described herein are only some of the embodiments of the present disclosure but do not represent all embodiments of the disclosure. All other embodiments that can be devised by those of ordinary skill in the art on the basis of the embodiments described herein and without making inventive efforts shall fall within the scope of the present disclosure.

Referring to the FIGURE, a schematic view illustrating steps of a preparing method of a glass substrate film sputtering target according to a preferred embodiment of the present disclosure is shown therein. The preparing method comprises the following steps.

Step S1: weighing an alloy material for forming the glass substrate film sputtering target;

Step S2: adding the alloy material weighed into a plasma pressure compaction sintering cavity and sintering the alloy material to obtain a sintered target, wherein the sintering temperature is 500° C.~1600° C. and the sintering time is 5~20 minutes; and Step S3: post-processing the sintered target.

The alloy material has a particle size of smaller than or equal to 100 nm, and the preparing method further comprises a step of externally applying a pressure to the plasma pressure compaction sintering cavity while the alloy material is sintered in the plasma pressure compaction sintering cavity.

The alloy material may have a composition of $Mo_xCu_yTi_z$, where x, y, z all range between 0·100% and x+y+z=100%. In this case, the sintering temperature is 1400° C.~1500° C. and the sintering time is 10~15 minutes, and the sintered target has a relative density of greater than or equal to 99.5% and an oxygen content of smaller than or equal to 500 ppm.

The alloy material may also have a composition of $(In_2O_3)_x(SnO_2)_y$, where y ranges between 0~7% and x+y=100%. In this case, the sintering temperature is 600° C.~700° C. and the sintering time is 10 minutes, and the sintered target has a relative density of greater than or equal to 99.8% and an oxygen content of smaller than or equal to 1000 ppm.

Hereinbelow, the preparing method of a glass substrate film sputtering target of the present disclosure will be described with reference to the following examples.

EXAMPLE 1

An alloy material having a composition of $Mo_xCu_yTi_z$ (x, y, z all range between 0·100% and x+y+z=100%) is weighed and added into the plasma pressure compaction sintering cavity. Then, the alloy material is sintered at a sintering temperature of 1400° C.~1500° C. for a sintering time of 10~15 minutes to obtain a sintered target. The sintered target is measured to have a relative density of ≥99.5% and an oxygen content of ≤500 ppm.

EXAMPLE 2

An alloy material having a composition of $Mo_xCu_yTi_z$ (x, y, z all range between 0·100% and x+y+z=100%) is weighed and added into the plasma pressure compaction sintering cavity. Then, the alloy material is sintered at a sintering temperature of 1500° C.~1600° C. for a sintering time of 16~20 minutes to obtain a sintered target. The sintered target is measured to have a relative density of ≥99.3% and an oxygen content of ≤400 ppm.

EXAMPLE 3

An alloy material ITO having a composition of $(In_2O_3)_x(SnO_2)_y$ (y ranges between 0~7% and x+y=100%) is weighed and added into the plasma pressure compaction sintering cavity. Then, the alloy material is sintered at a sintering temperature of 600° C.~700° C. for a sintering time of 10 minutes to obtain a sintered target. The sintered target is measured to have a relative density of ≥99.8% and an oxygen content of ≤1000 ppm.

EXAMPLE 4

An alloy material ITO having a composition of $(In_2O_3)_x(SnO_2)_y$ (y ranges between 0~7% and x+y=100%) is weighed and added into the plasma pressure compaction sintering cavity. Then, the alloy material is sintered at a sintering temperature of 600° C.~700° C. for a sintering time of 5~9 minutes to obtain a sintered target. The sintered target is measured to have a relative density of ≥99.6% and an oxygen content of ≤800 ppm.

The present disclosure further provides a glass substrate film sputtering target, which is prepared by the aforesaid preparing method and suitable for use in fabrication of a large-size TFT-LCD. The detailed preparing process thereof will not be further described herein.

The glass substrate film sputtering target and the preparing method thereof of the present disclosure adopt the plasma pressure compaction for quick sintering in place of the conventional hot pressing or cool pressing. The plasma pressure compaction for quick sintering has the following features when being used to prepare the glass substrate film sputtering target.

Firstly, the plasma is utilized to damage and remove the oxides and impurity layers on the surface of the sintered alloy material at an initial activation stage, and to provide a part of activation energy necessary for micro/nano combination of cleaning materials inside the alloy material particles to reduce the required processing temperature. This is very important for protecting the nanoscale nature of the particles by preventing growth of particles during the sintering process.

Secondly, by externally applying a pressure, compaction of the sintered alloy material can be accelerated, which is favorable for increasing the relative density and decreasing the oxygen content.

Thirdly, as compared to the sintering time of 2~3 hours which is taken when the conventional sintering process is used, the sintering time in the present disclosure is only about 10~15 minutes. Therefore, the sintering time and the target preparing time are shortened greatly, and the liability to oxidation or instability of the sintered alloy material is reduced. This makes it unnecessary to add an excessive amount of oxidizable material in the weighing process, so the composition of the alloy material can be controlled more finely to improve purity of the target.

Fourthly, the relative density of the target and the purity of the alloy material can be increased, the size of the alloy material can be reduced, and the composition of the alloy material can be finely controlled, which is favorable for improving uniformity of the film sputtered through physical vapor deposition, the product yield and the product quality in the panel producing factory.

According to the above descriptions, because the plasma pressure compaction for quick sintering is adopted for the glass substrate film sputtering target and the preparing method thereof of the present disclosure, quality of the target can be improved and the time necessary for preparing the target can be shortened.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A preparing method of a glass substrate film sputtering target, comprising the following steps of:
   weighing an alloy material for forming the glass substrate film sputtering target, wherein the alloy material has a particle size of smaller than or equal to 100 nm;
   adding the alloy material weighed into a plasma pressure compaction sintering cavity and sintering the alloy material while a pressure is externally applied to the plasma pressure compaction sintering cavity to obtain a sintered target, wherein the sintering temperature is 500° C.~1600° C. and the sintering time is 5-20 minutes; and
   post-processing the sintered target;
   wherein the alloy material has a composition of $Mo_xCu_yTi_z$, where x, y, z all range between 0~100% and x+y+z=100%.

2. The preparing method of claim 1, wherein the sintering temperature is 1400° C.~1500° C. and the sintering time is 10~15 minutes.

3. The preparing method of claim 2, wherein the sintered target has a relative density of greater than or equal to 99.5% and an oxygen content of smaller than or equal to 500 ppm.

4. A preparing method of a glass substrate film sputtering target, comprising the following steps of:
   weighing an alloy material for forming the glass substrate film sputtering target;
   adding the alloy material weighed into a plasma pressure compaction sintering cavity and sintering the alloy material to obtain a sintered target, wherein the sintering temperature is 500° C.~1600° C. and the sintering time is 10~20 minutes; and
   post-processing the sintered target;
   wherein the alloy material has a composition of $Mo_xCu_yTi_z$, where x, y, z all range between 0~100% and x+y+z=100%.

5. The preparing method of claim 4, wherein the alloy material has a particle size of smaller than or equal to 100 nm.

6. The preparing method of claim 4, wherein the sintering temperature is 1400° C.~1500° C. and the sintering time is 10~15 minutes.

7. The preparing method of claim 6, wherein the sintered target has a relative density of greater than or equal to 99.5% and an oxygen content of smaller than or equal to 500 ppm.

8. The preparing method of claim 4, further comprising:
   externally applying a pressure to the plasma pressure compaction sintering cavity while the alloy material is sintered in the plasma pressure compaction sintering cavity.

* * * * *